United States Patent
Miyazaki et al.

(10) Patent No.: US 7,727,860 B2
(45) Date of Patent: Jun. 1, 2010

(54) METHOD FOR MANUFACTURING BONDED WAFER AND OUTER-PERIPHERAL GRINDING MACHINE OF BONDED WAFER

(75) Inventors: Susumu Miyazaki, Nagano (JP); Tokio Takei, Nagano (JP); Keiichi Okabe, Nagano (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 192 days.

(21) Appl. No.: 11/920,761

(22) PCT Filed: May 18, 2006

(86) PCT No.: PCT/JP2006/309893
§ 371 (c)(1), (2), (4) Date: Nov. 20, 2007

(87) PCT Pub. No.: WO2006/129485
PCT Pub. Date: Dec. 7, 2006

(65) Prior Publication Data
US 2009/0042363 A1    Feb. 12, 2009

(30) Foreign Application Priority Data
May 31, 2005    (JP)    ............................. 2005-160439

(51) Int. Cl.
*H01L 21/00*    (2006.01)
(52) U.S. Cl. ............................... 438/459; 257/E21.088
(58) Field of Classification Search ......... 438/455–464; 451/1–27; 257/E21.088
See application file for complete search history.

(56) References Cited

U.S. PATENT DOCUMENTS 3,708,291 A * 1/1973 Cronkhite et al. ........... 430/57.8
3,708,921 A * 1/1973 Cronkhite et al. ............. 451/41

(Continued)

FOREIGN PATENT DOCUMENTS

JP    A-07-099295    4/1995

(Continued)

*Primary Examiner*—Richard A. Booth
(74) *Attorney, Agent, or Firm*—Oliff & Berridge, PLC (57) ABSTRACT

The present invention provides a method for manufacturing a bonded wafer, which includes at least the steps of bonding a bond wafer and a base wafer, grinding an outer peripheral portion of the bonded bond wafer, etching off an unbonded portion of the ground bond wafer, and then reducing a thickness of the bond wafer, wherein, in the step of grinding the outer peripheral portion, the bonded bond wafer is ground so as to form a groove along the outer peripheral portion of the bond wafer to form an outer edge portion outside the groove; and in the subsequent step of etching, the outer edge portion is removed together with the groove portion of the bond wafer to form a terrace portion where the base wafer is exposed at the outer peripheral portion of the bonded wafer. Thus, it is possible to provide a method for manufacturing a bonded wafer, which can reduce the number of dimples formed in a terrace portion of a base wafer upon removing an outer peripheral portion of a bonded bond wafer.

22 Claims, 6 Drawing Sheets

U.S. PATENT DOCUMENTS

| | | | |
|---|---|---|---|
| 4,662,124 A * | 5/1987 | Kato et al. | ................. 451/41 |
| 6,291,315 B1 | 9/2001 | Nakayama et al. | |
| 6,645,297 B1 * | 11/2003 | Suzuki et al. | ............... 118/110 |
| 7,242,444 B2 * | 7/2007 | Kamijima et al. | ............. 349/56 |
| 2001/0016423 A1 | 8/2001 | Sakamoto | |
| 2003/0102530 A1 | 6/2003 | Matsumoto et al. | |
| 2007/0072393 A1 * | 3/2007 | Aspar et al. | ................. 438/459 |

FOREIGN PATENT DOCUMENTS

| | | |
|---|---|---|
| JP | A-10-083986 | 3/1998 |
| JP | A-2000-091175 | 3/2000 |
| JP | A-2000-223452 | 8/2000 |

* cited by examiner

METHOD FOR MANUFACTURING BONDED WAFER AND OUTER-PERIPHERAL GRINDING MACHINE OF BONDED WAFER

TECHNICAL FIELD

The present invention relates to a method for manufacturing a bonded wafer and more specifically, the invention relates to a method for manufacturing a bond wafer comprising grinding an outer peripheral portion of a bonded bond wafer, followed by etching to remove an unbonded portion of the bonded bond wafer. In addition, the present invention relates to an outer-peripheral grinding machine of a bonded wafer, which is used for the method for manufacturing such a bonded wafer.

BACKGROUND ART

Bonded wafers prepared by bonding a bond wafer to a base wafer and then reducing the thickness of the wafer used for fabricating device (bond wafer), have been used as a wafer for a high-performance device.

An SOI wafer has been known as one of the bonded wafers. This wafer can be manufactured as follows, for instance. That is, two mirror-polished silicon wafers (bond wafer and base wafer) are prepared, and an oxide film is formed on at least one wafer. Then, these wafers are bonded and then subjected to heat treatment at 200 to 1200° C. to increase bonding strength. After that, the wafer used for fabricating device (bond wafer) is ground and polished down to a desired thickness to thereby complete an SOI wafer having an SOI (silicon on insulator) layer formed thereon.

Besides, a bonded wafer is manufactured by directly bonding silicon wafers together not through an oxide film in some cases. Further, an insulator wafer made of quartz, silicon carbide, alumina, or the like may be used as a base wafer.

Figure 4:
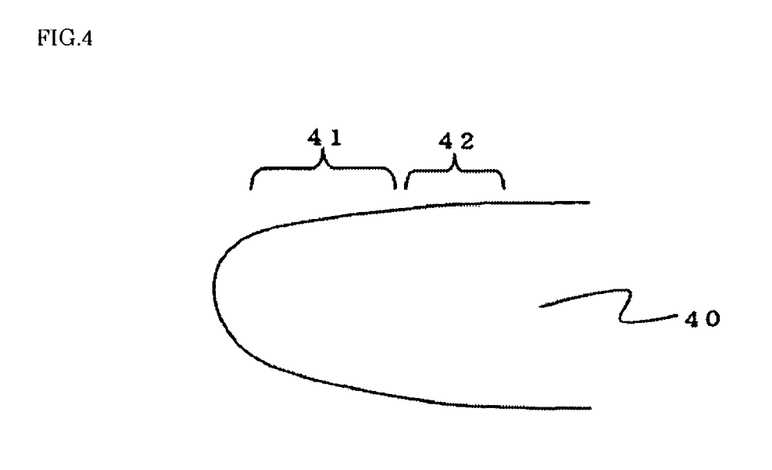
FIG. 4 is a schematic diagram showing conditions of an outer peripheral portion of a mirror-surface wafer before bonding.
Figure 5:
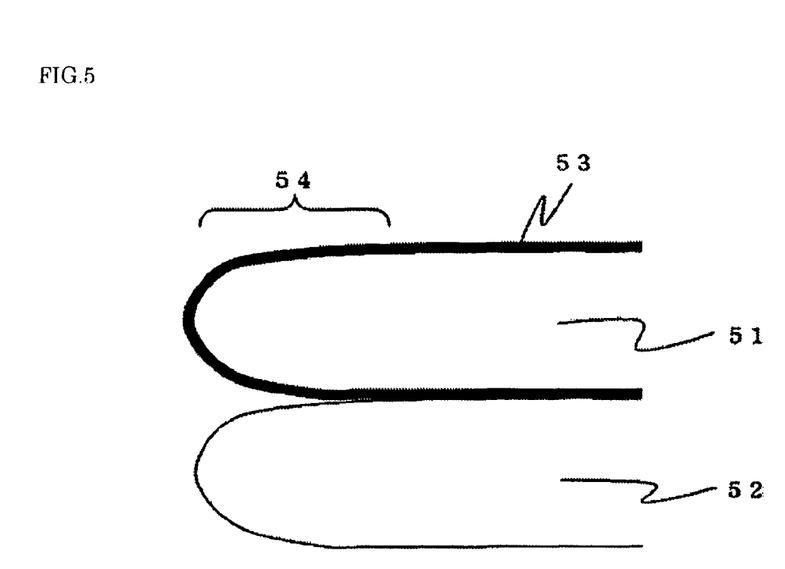
FIG. 5 is a schematic diagram showing conditions of an outer peripheral portion of bonded bond wafer and base wafer after bonding.

Referring now to FIGS. 4 and 5, conditions of an outer peripheral portion of a mirror-surface wafer before bonding and after bonding an outer peripheral portion of bonded bond wafer and base wafer are explained.

As shown in FIG. 4, the outer peripheral portion of a mirror-surface wafer 40 before bonding generally includes a chamfered portion 41 and a slightly thin portion called a polishing sag 42. If a bonded wafer is manufactured as above with the mirror-surface wafer 40, the chamfered portion 41 and the polishing sag 42 portion are not bonded and remain unbonded.

FIG. 5 shows this state. In FIG. 5, an oxide film 53 is formed on a bond wafer 51, and then a base wafer 52 is bonded thereto. As shown in FIG. 5, the chamfered portion or polishing sag portion of the mirror-surface wafer is left as an unbonded portion 54 after bonding. This unbonded portion 54 extends about 3 mm or less from the outer edge.

If the thickness of the bond wafer including such unbonded portions is reduced by grinding or the like, the unbonded portions are partially delaminated during the step of reducing the thickness. Thus, the thinned bond wafer might be smaller in diameter than a wafer as a base (base wafer) or an array of small irregularities might be formed in its peripheral portion.

If this bonded wafer is applied to a device manufacturing process, the remaining unbonded portion is delaminated during the process, with the result that particles are generated and the device yield is lowered.

Figure 6:
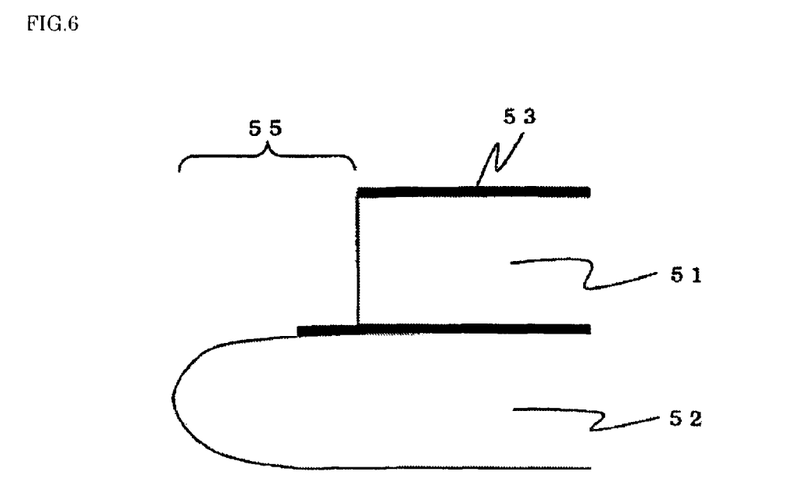
FIG. 6 is a schematic diagram showing a terrace portion formed before a step of reducing a thickness of a bond wafer.

To avoid such a situation, it is necessary to previously remove the unbonded portion left in the outer peripheral portion of the bond wafer before reducing the thickness of the bond wafer through grinding or the like. A portion obtained by removing the unbonded portion to expose the base wafer is referred to as a terrace portion. FIG. 6 shows a terrace portion 55 formed before the step of reducing the thickness of the bond wafer. In FIG. 6, reference numerals other than terrace portion 55 are identical to those of FIG. 5.

In general, two methods are conceivable for forming such a terrace portion.

To explain the first method, the entire surface of the bond wafer is ground through surface grinding, and a tape is put on the ground surface of the bond wafer except the outer peripheral portion of several mm from the outer edge. As a result, the outer peripheral portion of the bond wafer is exposed and then, the exposed portion of the bond wafer is melted and removed by etching to thereby form a terrace portion.

The second method is explained with reference to FIG. 3. Here, the case of bonding a bond wafer 31 having an oxide film 33 formed thereon to a base wafer 32 is explained by way of example (see FIG. 3(a)). First, the outer peripheral portion of several mm from the outer edge of the bond wafer 31 is ground by several mm into a thickness of 10 to 100 μm (see FIG. 3(b)). Then, the remaining is etched off to form a terrace portion 35 (see FIG. 3(c)).

The latter method has been employed in most cases to keep up with recent trend to automation and mass-production (see Japanese Unexamined Patent Application Publication No. 2000-223452, for example).

Moreover, a demand to increase a quality of the terrace portion recently grows, and it is required to produce smoother terrace portions with uniform quality.

If grinding and etching for forming a terrace portion are compared, etching is more likely to involve unevenness than grinding as a machining process due to temperature, composition, or other such conditions. Hence, in order to produce smooth terrace portions with uniform quality, an etching amount has to be reduced as much as possible. Thus, the etching amount is reduced and grinding removal is increased to meet the demand to increase the quality.

However, the following problem occurs as a result of reducing an etching amount and increasing grinding removal.

Figure 3:
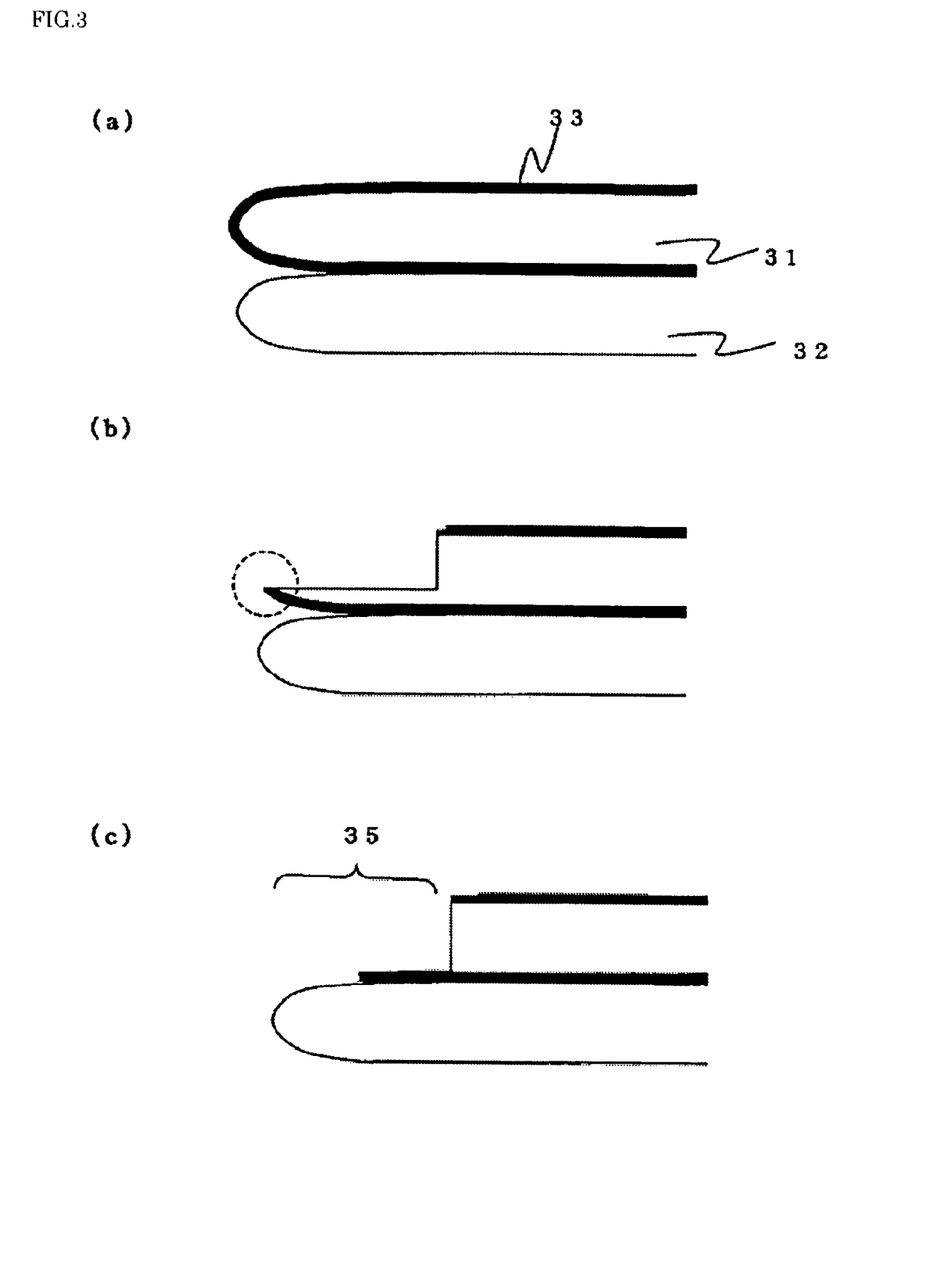
FIG. 3 is an explanatory view showing the case of grinding an outer peripheral portion of a bond wafer with a method of the prior art.

That is, if the grinding removal is increased, an outer peripheral portion of the bond wafer becomes too thin (see an encircled portion of FIG. 3(b)). The too-thin outer peripheral portion of the bond wafer is caught in a grind stone and then chips or delaminates in some cases. Moreover, if the chipped or delaminated portion damages an insulator film underlying the bond wafer, corrosion proceeds up to the base wafer in a subsequent etching step, resulting in small recesses (dimples) in the terrace portion. As a result, a product is unusable for practical applications, which causes reduction in production yield. Further, the terrace dimples cause a problem such as dusting during a device manufacturing process. The wafer cannot function as an SOI wafer in some cases.

Due to the unbonded portions corresponding to the shape of the chamfered portion of the outer peripheral portion of the bond wafer and the polishing sag, the outer peripheral portion of the bond wafer becomes too thin when the polishing removal is increased. That is, the outer peripheral portion of several hundreds μm from the outer edge is delaminated from the base wafer as described above. As a result, the outer peripheral portion of the wafer is broken, chips, or delaminates due to vibrations or shock applied upon grinding with the grind stone.

As described above, in the case of removing the outer peripheral portion of the bonded bond wafer to form a terrace portion, dimples formed in the terrace portions cannot be entirely prevented and there is still room for improvement.

DISCLOSURE OF INVENTION

The present invention has been accomplished in view of the above problems, and it is accordingly an object of the present invention to provide a method for manufacturing a bonded wafer, which can reduce the number of dimples formed in a terrace portion of a base wafer upon removing an outer peripheral portion of a bonded bond wafer.

To attain the above object, the present invention provides a method for manufacturing a bonded wafer, comprising at least the steps of bonding a bond wafer and a base wafer, grinding an outer peripheral portion of the bonded bond wafer, etching off an unbonded portion of the ground bond wafer, and then reducing a thickness of the bond wafer, wherein, in the step of grinding the outer peripheral portion, the bonded bond wafer is ground so as to form a groove along the outer peripheral portion of the bond wafer to form an outer edge portion outside the groove; and in the subsequent step of etching, the outer edge portion is removed together with the groove portion of the bond wafer to form a terrace portion where the base wafer is exposed at the outer peripheral portion of the bonded wafer.

As described above, in a conventional method of grinding an outer peripheral portion of a bonded wafer, the whole peripheral portion of a bond wafer is thinned. In this case, the outer peripheral portion of the thinned bond wafer is likely to chip or delaminate. However, according to the present invention, the outer peripheral portion is ground to form a groove along the outer peripheral portion of the bond wafer, and an outer edge portion outside the groove is left with a thickness that ensures enough strength. Then, the outer edge portion is removed together with the groove portion in a subsequent etching step. Thus, chipping or delamination hardly occurs in the outer peripheral portion of the bond wafer. Therefore, dimples are rarely formed in a terrace portion upon grinding and etching the outer peripheral portion. Hence, a high-quality bonded wafer can be manufactured with high yield.

Further, in the method for manufacturing a bonded wafer according to the present invention, preferably, a width of the outer edge portion outside the groove of the bond wafer, which is formed through the grinding, is set not smaller than a width of a chamfered portion of the bond wafer and 2 mm or less.

If the width of the outer edge portion is set not smaller than a width of a chamfered portion of the bond wafer and 2 mm or less, strength of the outer edge portion after grinding can be kept high.

Further, in the method for manufacturing a bonded wafer according to the present invention, preferably, a depth of the groove of the bond wafer formed through the grinding is determined so as to leave the bond wafer in the groove by a thickness of 5 μm or more and 80 μm or less.

The thinner the thickness of the bond wafer to be left after grinding is, the less an etching amount required in a subsequent step becomes. However, in the conventional outer peripheral grinding method, the whole outer peripheral portion of the bond wafer is thinned, so if the thickness of the left bond wafer is 80 μm or less, chipping or the like is more likely to occur in the outer peripheral portion. Thus, it is difficult to set the thickness to 80 μm or less. However, according to the present invention, grinding is carried out for forming a groove, and an outer edge portion formed outside the groove is left with a thickness that ensures enough strength, so the thickness of the wafer in the groove portion can be set to 5 μm or more and 80 μm or less.

Further, in the method for manufacturing a bonded wafer according to the present invention, the outer peripheral portion can be etched with an acid or alkali.

The outer edge portion can be removed together with the groove portion of the bond wafer through etching with an acid or alkali to thereby form a terrace portion where the base wafer is exposed at the outer peripheral portion of the bonded wafer.

Further, in the method for manufacturing a bonded wafer according to the present invention, the outer peripheral portion may be ground by cutting into the bond wafer with a rotating round-bar-like grind stone having a rotational axis vertical to a main surface of the bonded wafer and an outer diameter not larger than a width of the groove in the step of grinding the outer peripheral portion.

A so-called end mill type grind stone used for the above grinding process can move precisely along an irregular shape and form a discontinuous groove. Thus, it is possible to form a groove in one stroke along the outer peripheral portion of the wafer regardless of an orientation flat portion and a notch portion of the wafer. Hence, the outer edge portion can fall down in a perfect ring shape including almost no chipping, and the number of terrace dimples can be further reduced.

Alternatively, the outer peripheral portion may be ground by bringing a rotating disk-like grind stone that has a rotational axis parallel to a main surface of the bonded wafer and a thickness not larger than a width of the groove, into contact with the bond wafer from above in the step of grinding the outer peripheral portion.

A so-called dicer type grind stone used for the above grinding process excels in processing efficiency such as a processing speed. Thus, grinding can be completed within a shorter period.

Alternatively, it is possible that the outer peripheral portion is ground such that at least one of an orientation flat portion and a notch portion is formed by cutting into the bond wafer with a rotating round-bar-like grind stone having a rotational axis vertical to a main surface of the bonded wafer and an outer diameter not larger than a width of the groove, and the other portions are formed by bringing a rotating disk-like grind stone that has a rotational axis parallel to a main surface of the bonded wafer and a thickness not larger than a width of the groove, into contact with the bond wafer from above, in the step of grinding the outer peripheral portion.

As described above, if the end mill type grind stone suitable for a discontinuous shape is used to form the orientation flat portion and notch portion of the wafer, and the dicer type grind stone superior in processing efficiency is used to form the other portion, that is, the arc portion, grinding can be completed within a shorter period than in the case of grinding the wafer only with the end mill type grind stone. Moreover, in the subsequent etching step, the outer edge portion can be cut as cleanly as the case of using only the end mill type grind stone.

In this case, preferably, the outer diameter of the round-bar-like grind stone is set to 5 mm or less.

If the outer diameter of the round-bar-like grind stone is set to 5 mm or less, fine patterning is realized, and a groove can be finely formed.

Further, in the method for manufacturing a bonded wafer according to the present invention, preferably, etching is carried out immediately after the step of grinding the outer peripheral portion without encasing the wafer.

The outer peripheral portion of the wafer becomes fragile as a result of forming the groove. Therefore, there is a fear of the outer peripheral portion being broken if applied with a mechanical external force due to handling or the like. To avoid such a situation, the wafer should be etched immediately after grinding the outer peripheral portion, without encasing the wafer as described above.

Further, the present invention provides an outer-peripheral grinding machine of a bonded wafer, including at least: a turntable adsorptively holding a bonded wafer prepared by bonding a bond wafer and a base wafer; a round-bar-like grind stone having a rotational axis vertical to a main surface of the bonded wafer; and a moving mechanism that can move the grind stone relative to the turntable, the moving mechanism relatively moving the grind stone along an outer peripheral portion of the bond wafer of the bonded wafer held on the turntable to grind the bond wafer to form a groove along the outer peripheral portion of the bond wafer.

As described above, the outer-peripheral grinding machine of a bonded wafer according to the present invention includes a so-called end mill type grind stone. The moving mechanism of the grinding machine relatively moves the grind stone along the outer peripheral portion of the bond wafer of the bonded wafer held on the turntable to grind the bond wafer to form a groove along the outer periphery of the bond wafer.

It is preferred that the outer-peripheral grinding machine further include a disk-like grind stone having a rotational axis parallel to the main surface of the bonded wafer.

If the outer-peripheral grinding machine includes a disk-like grind stone in addition to the end mill type one as described above, various types of wafers can be efficiently ground with one outer-peripheral grinding machine such that an orientation flat portion and a notch portion are formed with the end mill type grind stone, and the other portion is formed with the dicer type grind stone, for example.

As described above, according to the present invention, the outer peripheral portion of the bond wafer is ground to form a groove along the outer peripheral portion in the step of grinding the outer peripheral portion, and the outer edge portion formed outside the groove is left with such a thickness as ensures enough strength. The outer edge portion can be removed together with the groove portion in a subsequent etching step. Thus, chipping or delamination hardly occurs during grinding. Therefore, dimples are rarely formed in a terrace portion upon grinding and etching the outer peripheral portion, and a high-quality bonded wafer can be manufactured with high yield.

BEST MODES FOR CARRYING OUT THE INVENTION

The present inventors have made extensive studies to develop a method for suppressing chipping or delamination upon grinding, which would cause dimples in a terrace portion.

As a result, the inventors have conceived that if a bonded bond wafer is ground so as to form a groove along an outer peripheral portion instead of uniformly thinning the whole outer peripheral portion at the time of grinding the outer peripheral portion of the bond wafer, and thus, an outer edge portion is formed outside the groove with such a thickness as ensures enough strength, chipping or delamination hardly occurs during grinding, and the outer edge portion can be etched off in a subsequent step, with the result that the number of dimples formed in the terrace portion can be more reduced, and have accomplished the present invention.

Hereinafter, a method for manufacturing a bonded wafer according to the present invention will be described in detail with reference to FIG. 2. However, the present invention is not limited thereto.

First, a bond wafer 21 and a base wafer 22 as material wafers for manufacturing an SOI wafer through bonding (silicon single-crystal wafer: a wafer manufactured by a Czochralski method and having a diameter of 8 inches (200 mm) and crystal orientation to <100> plane, for example) are prepared. Then, the bond wafer 21 out of the prepared silicon single-crystal wafers is subjected to heat treatment to form an oxide film 23 on the wafer surface.

Needless to say, an oxide film may be formed on the base wafer 22, not the bond wafer 21, or may be formed on both of the wafers.

Figure 2:
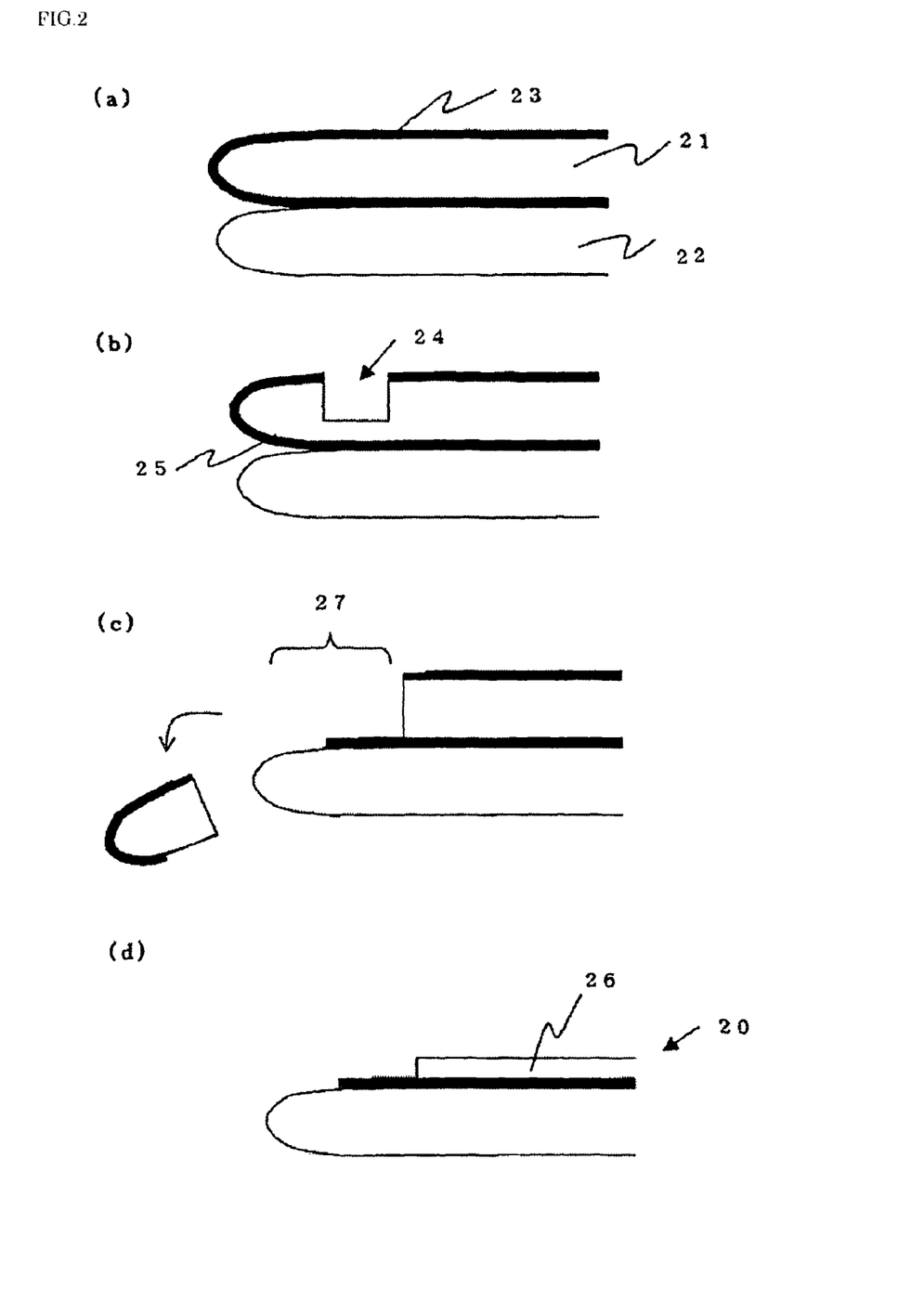
FIG. 2 is an explanatory view showing the case of grinding an outer peripheral portion of a bond wafer with a method according to the present invention.

Next, the bond wafer 21 having the oxide film 23 formed thereon is bonded to the base wafer 22 under a clean atmosphere (see FIG. 2(a)).

Heat treatment is additionally performed under an oxidizing atmosphere to firmly bond the bond wafer 21 and the base wafer 22 together. As for heat treatment conditions, heat treatment may be performed, for example, at 200° C. to 1200° C. under an oxygen or water vapor-contained atmosphere.

Unbonded portions of the bond wafer 21 and base wafer 22 remain in an outer peripheral portion of the thus-bonded bond wafer 21 and base wafer 22. Such unbonded portions cause various problems, for example, the wafer cannot be used as an SOI layer for fabricating a device and in addition, would be broken in a subsequent step. Thus, these portions need to be removed. A process therefor is given next.

Subsequently, an outer peripheral portion of the bonded bond wafer 21 is ground (see FIG. 2(b)).

At this time, the outer peripheral portion is ground so as to form a groove 24 along the outer peripheral portion of the bond wafer 21 to form an outer edge portion 25 outside the groove 24.

Figure 1:
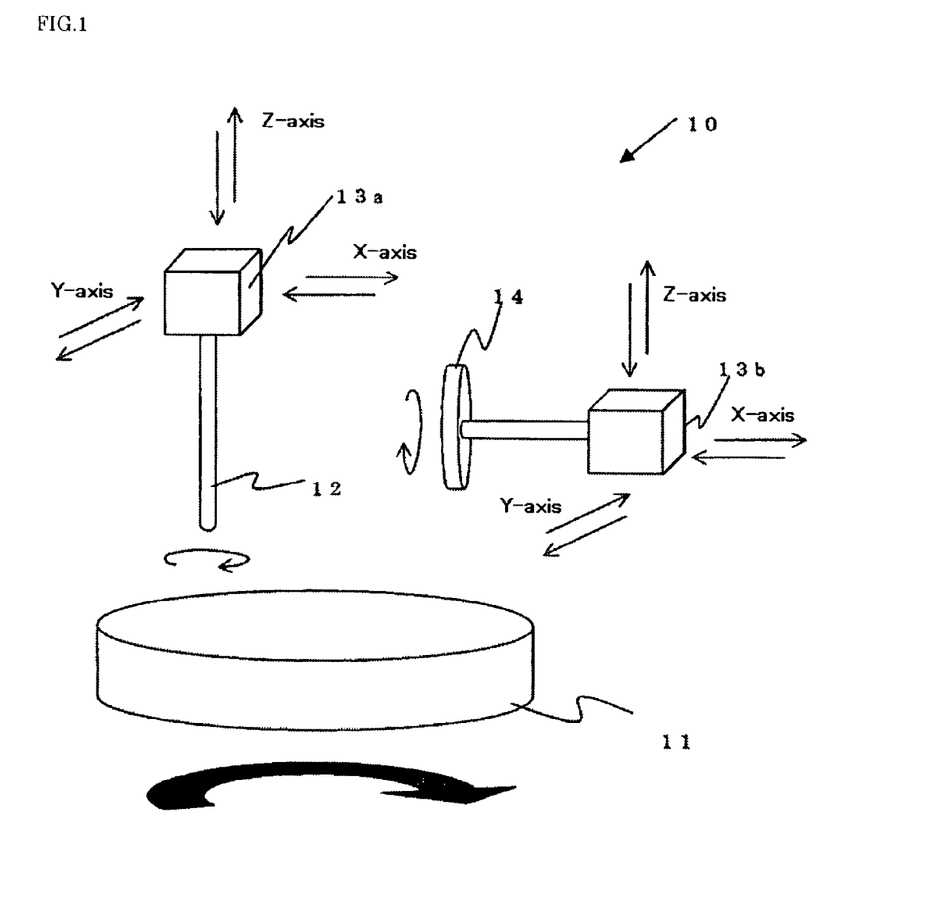
FIG. 1 is a schematic diagram showing an example of an outer-peripheral grinding machine of a bonded wafer according to the present invention.

The groove 24 may be formed by an outer-peripheral grinding machine as shown in FIG. 1, for example.

An outer-peripheral grinding machine 10 includes a turntable 11 that can adsorptively hold a bonded wafer, a round-bar-like grind stone 12 having a rotational axis vertical to a main surface of the bonded wafer, and a moving mechanism 13a that can move the round-bar-like grind stone 12 relative to the turntable 11. The round-bar-like grind stone 12 can be moved in X-axis, Y-axis, and Z-axis directions by means of the moving mechanism 13a. Among those, the movement in the X-axis and Y-axis directions is a so-called feeding motion, and the movement in the Z-axis direction is a so-called cutting motion. Needless to say, movement of the round-bar-like grind stone 12 may be removed in either the X-axis direction or the Y-axis direction, that is, the round-bar-like grind stone may be moved in only one direction of the X-axis and Y-axis directions. Further, the turntable 11 may be moved in the X-axis, Y-axis, and Z-axis directions.

Then, the moving mechanism 13a relatively moves the grind stone 12 along the outer peripheral portion of the bond wafer as the bond wafer held on the turntable 11 to grind the bond wafer. In this way, a groove can be formed along the outer periphery of the bond wafer as above.

Figure 7:
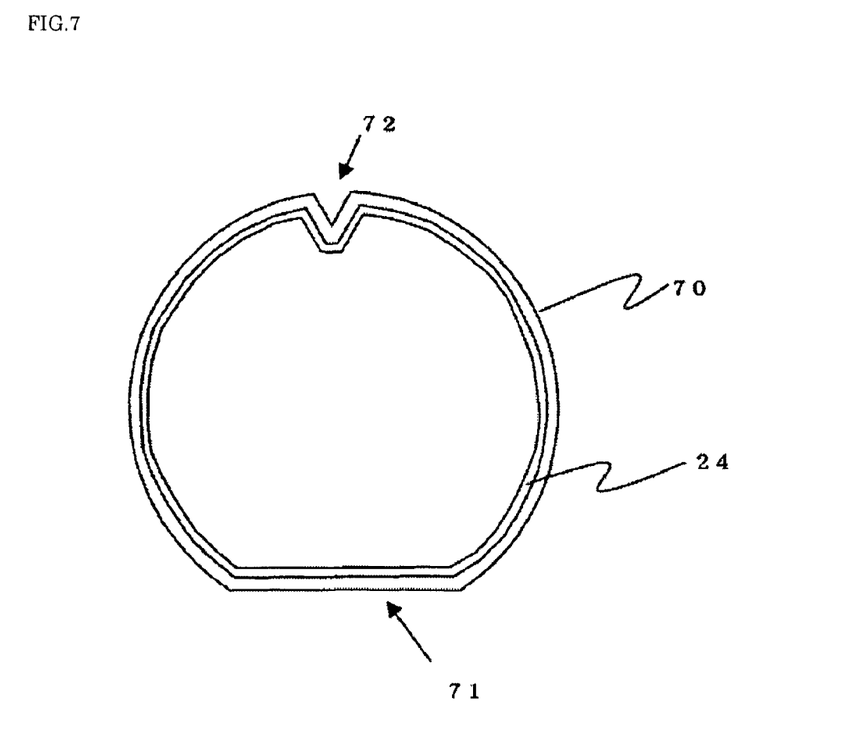
FIG. 7 is a plan view showing an example of a wafer shape and a shape of a groove formed along an outer peripheral portion of the wafer.

A so-called end mill type grind stone is suitable for formation of discontinuous grooves. As shown in FIG. 7, in general, a wafer 70 is not perfectly round but involves an orientation flat portion 71 and a notch portion 72. However, the end mill type grind stone can move precisely along an irregular shape and thus, can form the groove 24 in one stroke along the outer peripheral portion of the wafer regardless of the orientation flat portion and the notch portion of the wafer.

Incidentally, it is preferable to set the outer diameter of the round-bar-like grind stone to 5 mm or less. If the outer diameter of the round-bar-like grind stone is 5 mm or less, micromachining is realized and a fine groove can be formed. On the other hand, in the case of using the round-bar-like grind stone, it is preferred to set the outer diameter to 1 mm or more from the viewpoint of durability.

Further, the outer-peripheral grinding machine 10 additionally includes a disk-like grind stone 14 having a rotational axis parallel to the main surface of the bonded wafer. The disk-like grind stone 14 can be moved in X-axis, Y-axis, and Z-axis directions by means of a moving mechanism 13b.

A so-called dicer type grind stone excels in processing efficiency such as a processing speed. Thus, grinding can be completed within a shorter period.

Incidentally, as for grinding with the dicer type grind stone, the present inventors have made comparison between commonly-called down-cutting and up-cutting and found that chipping can be more suppressed at the start and completion of cutting, in up-cutting than in generally-used down-cutting.

However, the dicer-type grind stone cannot move precisely along an irregular shape. Therefore, it is desirable that a round-bar-like grind stone (end mill type grind stone) having a rotational axis vertical to the main surface of the bonded wafer and the outer diameter not larger than the groove width rotatingly cuts into the bond wafer to grind the wafer to form at least one of the orientation flat portion and the notch portion, and a disk-like grind stone (dicer type grind stone) having a rotational axis parallel to the main surface of the bonded wafer and a width not larger than the groove width, rotatingly comes into contact with the bond wafer from above to grind the wafer to shape the other portion, that is, an arc-shaped portion.

In this case, the width of the outer edge portion outside the groove of the bond wafer formed by grinding is preferably set not smaller than the width of the chamfered portion of the bond wafer and 2 mm or less, more preferably, 10 to 1000 μm. If the width of the outer edge portion is set not smaller than the width of the chamfered portion of the bond wafer and 2 mm or less, strength of the outer edge portion after grinding can be kept high, and unbonded portions can be more reliably removed.

Further, it is preferable to determine a depth of the groove of the bond wafer formed by grinding such that the bond wafer thickness in the groove portion is 5 μm or more and 80 μm or less. If so, a load of a subsequent etching step can be reduced well. The groove width is preferably several hundreds μm or more and several mm or less. In this case, combined with the width of the outer edge portion, the groove width makes it possible to remove unbonded portions and etch off the outer edge portion without fail.

Incidentally, as for the groove shape, the round-bar-like grind stone and the disk-like grind stone may be used to form a single groove or plural grooves. Moreover, in the case of a single groove formed, a single groove may be formed by connecting plural grooves.

Next, the unbonded portions are etched off (see FIG. 2(c)).

This process can be easily carried out by immersing (dipping) a bonded wafer in an etchant that can dissolve silicon single-crystal at very high etching rate rather than dissolves an oxide film. That is, the groove portion formed along the outer peripheral portion of the bond wafer 21 exposes silicon due to grinding and thus is etched with the etchant, but the other portions of the bonded wafer are covered with the oxide film 23 and thus not etched (an oxide film is also formed on the surface of the base wafer 22 through bonding heat treatment carried out upon bonding). If etching proceeds in the groove portion, the outer edge portion 25 cannot be supported and falls down at the same time. In this way, the outer edge portion 25 is removed together with the groove portion of the bond wafer 21 to form a terrace portion 27 where the base wafer 22 is exposed along the outer peripheral portion of the bonded wafer.

Example of the etching may include so-called alkaline etching using KOH, NaOH, or the like. Needless to say, acid etching may be employed. Further, single-wafer etching, typified by spin etching, may be carried out instead of the dipping process.

Incidentally, the outer peripheral portion of the wafer becomes fragile as a result of forming the groove through grinding. Therefore, there is a fear of the outer edge portion of the outer peripheral portion being broken if applied with vibrations due to handling or the like or mechanical external force. To avoid such a situation, the wafer should be etched immediately after grinding the outer peripheral portion, without encasing the wafer. That is, single-wafer etching or other such etching should be carried out immediately after grinding the outer peripheral portion without packing the wafer into a container or cassette and transferring the packed wafer.

Finally, the surface of the bond wafer 21 is thinned into a desired thickness through grinding or polishing based on a general method to thereby complete an SOI wafer (bonded wafer) 20 having an SOI layer 26 formed thereon (see FIG. 2(d)).

The present invention will be described in detail below based on examples and comparative examples. However, the present invention is not limited thereto.

Example 1

A bonded wafer was manufactured in accordance with a procedure of FIG. 2.

First, 10 mirror-polished CZ wafers having the diameter of 150 mm (6 inches), a thickness of 625 microns, a p-type conductivity, and a resistivity of 4 to 6 Ω·cm were prepared and divided into 5 wafers for bond wafers and 5 wafers for base wafers. Among those, the bond wafer 21 was subjected to heat treatment and the oxide film 23 was formed on the surface of the bond wafer.

Then, the bond wafer 21 having the oxide film 23 formed thereon and the base wafer 22 were bonded together under clean atmosphere and then, subjected to bonding heat treatment at 1200° C. under an oxidizing atmosphere to manufacture 5 bonded wafers in total (see FIG. 2(a)).

Next, the bond wafer 21 was ground to form the groove 24 along the outer peripheral portion thereof to form the outer edge portion 25 outside the groove 24 (see FIG. 2(b)).

At this time, the width of the outer edge portion 25 was set to 500 μm from the outer edge so as to cover the 400 μm-wide chamfered portion of the bond wafer 21. Further, the depth of the groove 24 was determined to leave the thickness of the bond wafer at the groove 24 by 30 μm. Then, the outer-peripheral grinding machine 10 of FIG. 1 was used to grind the bonded wafer such that the end mill type grind stone 12 having the outer diameter of 5 mm rotatingly cuts the bond wafer to form the orientation flat portion and notch portion of the bonded wafer and the dicer type grind stone 14 having the cutter thickness of 0.5 mm is rotatingly brought into contact with the bond wafer 21 from above to form the arc portion in accordance with the up-cutting process.

Then, the wafer was dipped in a NaOH etchant and etched with etching removal of 100 μm in terms of wafer thickness (see FIG. 2(c)). During the etching process, the groove portion was dissolved in the etchant, and the outer edge portion fell down in a ring shape and then was dissolved. Incidentally, at this time, single-wafer etching was carried out immediately without packing the wafer in a container or a cassette.

Finally, the bond wafer 21 was thinned through grinding or polishing (FIG. 2(d)).

Figure 8:
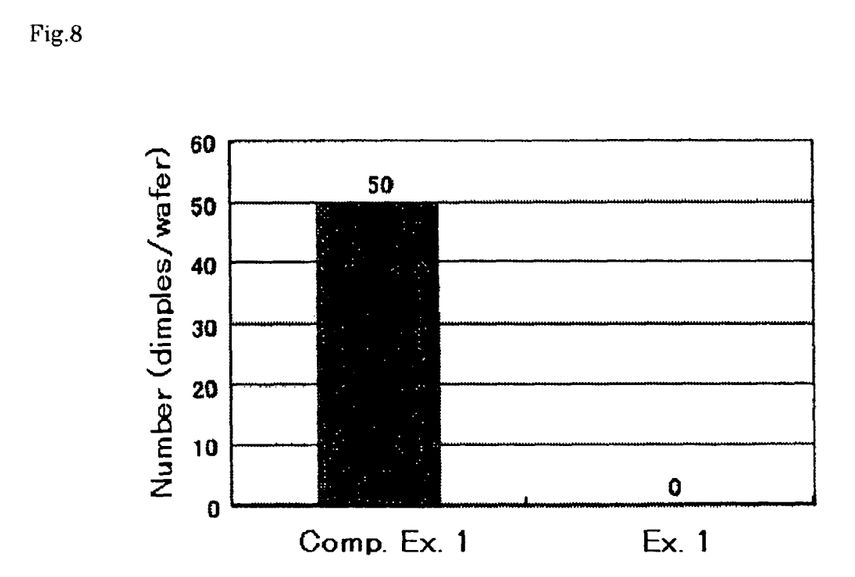
FIG. 8 is a graph showing a comparison result of the number of dimples formed in a terrace portion (Example 1 and Comparative Example 1).

The thus-prepared 5 SOI wafers were observed with an optical microscope to count the number of dimples formed in the terrace portion on the base wafer surface. FIG. 8 summarizes the counting result. As shown in FIG. 8, dimples that might be formed due to grinding, were not detected in the wafers ground by the method of the present invention.

Comparative Example 1

A bonded wafer was manufactured in the same manner as Example 1 except that an outer peripheral portion was ground and etched in accordance with the method of FIG. 3.

That is, a 3 mm-wide outer peripheral portion of the bonded bond wafer 31 was thinned into the thickness of 80 μm through grinding (see FIG. 3(b)). Next, the remaining portions were etched off to form the terrace portion 35 (see FIG. 3(c)).

The thus-prepared 5 SOI wafers were observed with an optical microscope to count the number of dimples formed in the terrace portion on the base wafer surface in the same manner as Example 1. FIG. 8 summarizes the counting result. As shown in FIG. 8, 50 dimples per wafer in average were detected in the wafers ground by the method of Comparative Example 1 as a conventional method.

The present invention is not limited to the embodiment described above. The above-described aspects are mere examples and those having substantially the same structure as technical ideas described in the appended claims and providing the similar functions and advantages are included in the scope of the present invention.

For example, the description of the above embodiment focuses on the case of bonding two semiconductor wafers, particularly, silicon wafers to manufacture a bonded wafer. However, an unbonded peripheral portion is involved in the case of bonding a semiconductor wafer to an insulator wafer made of quartz, silicon carbide, silicon nitride, alumina, sapphire, or other ceramic materials to manufacture a bonded wafer. Hence, the present invention is also effective for removal of such portions.

The invention claimed is:

1. A method for manufacturing a bonded wafer comprising at least the steps of bonding a bond wafer and a base wafer, grinding an outer peripheral portion of the bonded bond wafer, etching off an unbonded portion of the ground bond wafer, and then reducing a thickness of the bond wafer, wherein:
   in the step of grinding the outer peripheral portion, the bonded bond wafer is ground so as to form a groove along the outer peripheral portion of the bond wafer to form an outer edge portion outside the groove; and
   in the subsequent step of etching, the outer edge portion is removed together with the groove portion of the bond wafer to form a terrace portion where the base wafer is exposed at the outer peripheral portion of the bonded wafer.

2. The method for manufacturing a bonded wafer according to claim 1, wherein a width of the outer edge portion outside the groove of the bond wafer, which is formed through the grinding, is set not smaller than a width of a chamfered portion of the bond wafer and 2 mm or less.

3. The method for manufacturing a bonded wafer according to claim 1, wherein a depth of the groove of the bond wafer formed through the grinding is determined so as to leave the bond wafer in the groove by a thickness of 5 μm or more and 80 μm or less.

4. The method for manufacturing a bonded wafer according to claim 2, wherein a depth of the groove of the bond wafer formed through the grinding is determined so as to leave the bond wafer in the groove by a thickness of 5 μm or more and 80 μm or less.

5. The method for manufacturing a bonded wafer according to claim 1, wherein the outer peripheral portion is etched with an acid or alkali.

6. The method for manufacturing a bonded wafer according to claim 2, wherein the outer peripheral portion is etched with an acid or alkali.

7. The method for manufacturing a bonded wafer according to claim 3, wherein the outer peripheral portion is etched with an acid or alkali.

8. The method for manufacturing a bonded wafer according to claim 4, wherein the outer peripheral portion is etched with an acid or alkali.

9. The method for manufacturing a bonded wafer according to claim 1, wherein the outer peripheral portion is ground by cutting into the bond wafer with a rotating round-bar-like grind stone having a rotational axis vertical to a main surface of the bonded wafer and an outer diameter not larger than a width of the groove in the step of grinding the outer peripheral portion.

10. The method for manufacturing a bonded wafer according to claim 8, wherein the outer peripheral portion is ground by cutting into the bond wafer with a rotating round-bar-like grind stone having a rotational axis vertical to a main surface of the bonded wafer and an outer diameter not larger than a width of the groove in the step of grinding the outer peripheral portion.

11. The method for manufacturing a bonded wafer according to claim 1, wherein the outer peripheral portion is ground by bringing a rotating disk-like grind stone that has a rotational axis parallel to a main surface of the bonded wafer and a thickness not larger than a width of the groove, into contact with the bond wafer from above in the step of grinding the outer peripheral portion.

12. The method for manufacturing a bonded wafer according to claim 8, wherein the outer peripheral portion is ground by bringing a rotating disk-like grind stone that has a rotational axis parallel to a main surface of the bonded wafer and a thickness not larger than a width of the groove, into contact with the bond wafer from above in the step of grinding the outer peripheral portion.

13. The method for manufacturing a bonded wafer according to claim 1, wherein the outer peripheral portion is ground such that at least one of an orientation flat portion and a notch portion is formed by cutting into the bond wafer with a rotating round-bar-like grind stone having a rotational axis vertical to a main surface of the bonded wafer and an outer diameter not larger than a width of the groove, and the other portions are formed by bringing a rotating disk-like grind stone that has a rotational axis parallel to a main surface of the bonded wafer and a thickness not larger than a width of the groove, into contact with the bond wafer from above, in the step of grinding the outer peripheral portion.

14. The method for manufacturing a bonded wafer according to claim 8, wherein the outer peripheral portion is ground such that at least one of an orientation flat portion and a notch portion is formed by cutting into the bond wafer with a rotating round-bar-like grind stone having a rotational axis vertical to a main surface of the bonded wafer and an outer diameter not larger than a width of the groove, and the other portions are formed by bringing a rotating disk-like grind stone that has a rotational axis parallel to a main surface of the bonded wafer and a thickness not larger than a width of the groove, into contact with the bond wafer from above, in the step of grinding the outer peripheral portion.

15. The method for manufacturing a bonded wafer according to claim 9, wherein the outer diameter of the round-bar-like grind stone is set to 5 mm or less.

16. The method for manufacturing a bonded wafer according to claim 10, wherein the outer diameter of the round-bar-like grind stone is set to 5 mm or less.

17. The method for manufacturing a bonded wafer according to claim 13, wherein the outer diameter of the round-bar-like grind stone is set to 5 mm or less.

18. The method for manufacturing a bonded wafer according to claim 14, wherein the outer diameter of the round-bar-like grind stone is set to 5 mm or less.

19. The method for manufacturing a bonded wafer according to claim 1, wherein etching is carried out immediately after the step of grinding the outer peripheral portion without encasing the wafer.

20. The method for manufacturing a bonded wafer according to claim 12, wherein etching is carried out immediately after the step of grinding the outer peripheral portion without encasing the wafer.

21. The method for manufacturing a bonded wafer according to claim 16, wherein etching is carried out immediately after the step of grinding the outer peripheral portion without encasing the wafer.

22. The method for manufacturing a bonded wafer according to claim 18, wherein etching is carried out immediately after the step of grinding the outer peripheral portion without encasing the wafer.

* * * * *